(12) United States Patent
Lin

(10) Patent No.: US 6,348,301 B1
(45) Date of Patent: Feb. 19, 2002

(54) METHOD OF REDUCING A CRITICAL DIMENSION OF A PATTERNED PHOTORESIST LAYER

(75) Inventor: Chih-Yung Lin, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/427,793

(22) Filed: Oct. 27, 1999

(51) Int. Cl.[7] .................................................. G03F 7/40
(52) U.S. Cl. ........................ 430/330; 430/311; 430/313; 430/323
(58) Field of Search ................................. 430/330, 313, 430/323, 31, 325, 311

(56) References Cited

U.S. PATENT DOCUMENTS

| | | | | |
|---|---|---|---|---|
| 4,546,066 A | * | 10/1985 | Field et al. | ................. 430/314 |
| 5,366,851 A | * | 11/1994 | Novembre | .................. 430/322 |
| 5,470,693 A | * | 11/1995 | Sachdev et al. | ............ 430/315 |
| 5,609,994 A | * | 3/1997 | Lee | ............................. 430/323 |
| 6,117,622 A | * | 9/2000 | Eisele et al. | ................ 430/328 |

* cited by examiner

*Primary Examiner*—Janet Baxter
*Assistant Examiner*—Amanda C. Walke
(74) *Attorney, Agent, or Firm*—Thomas, Kayden, Horstemeyer & Risley

(57) ABSTRACT

A method of lowering critical dimensions. A film layer and a photoresist layer are sequentially formed over a substrate. The photoresist layer is exposed and developed to form a plurality of first openings. A first baking of the photoresist layer is carried out, permitting the photoresist layer to flow. A second baking is next carried out so that the width of the first openings is reduced linearly with time until a desired dimension is reached. Using the photoresist layer as a mask, the film layer is etched to form a plurality of second openings.

13 Claims, 4 Drawing Sheets

METHOD OF REDUCING A CRITICAL DIMENSION OF A PATTERNED PHOTORESIST LAYER

BACKGROUND OF THE INVENTION

1. Field of Invention

The present invention relates to a photolithographic method. More particularly, the present invention relates to a method of reducing a critical dimension of a patterned photoresist layer during the manufacturing of integrated circuits.

2. Description of Related Art

Due to the rapid development of integrated circuit fabricating techniques, dimensions of individual semiconductor devices have become smaller so that more devices are integrated into a single silicon chip. However, miniaturization of a semiconductor device depends very much on controlling critical dimensions in photolithography.

Raising the line width resolution in a photolithographic operation beyond 0.18 μm in the current state of technology is rather difficult unless a light source having a shorter wavelength is used, along with a short wavelength photoresist. Reducing wavelength of light source, however, means that old machines have to be entirely replaced by new, costly machines.

SUMMARY OF THE INVENTION

The present invention provides a method of lowering the critical dimensions of a semiconductor device without needing to replace existing manufacturing equipment.

To achieve these and other advantages and in accordance with the purpose of the invention, as embodied and broadly described herein, the invention provides a method of reducing a critical dimension of a patterned photoresist layer, which is suitable for a substrate having a patterned photoresist layer formed thereon. In the method, the patterned photoresist layer is baked at a first temperature, wherein the first temperature is higher enough to make the patterned photoresist layer expand laterally. The patterned photoresist layer is then baked at a second temperature to make the patterned photoresist layer expand laterally at a fixed rate.

The first temperature is greater than a melting point or a glass transition temperature of the patterned photoresist layer.

If the patterned photoresist layer is made of a deep-UV material and the patterned photoresist layer is used as a deep ultraviolet photoresist, the patterned photoresist layer is baked at the first temperatures of about 145° C. for 90 seconds.

If the patterned photoresist layer is made of a deep-UV material and the patterned photoresist layer is used as a deep ultraviolet photoresist, the patterned photoresist layer is baked at the second temperature of about 161° C. for 70 seconds.

To achieve these and other advantages and in accordance with the purpose of the invention, as embodied and broadly described herein, the invention provides a method of reducing a critical dimension of a patterned photoresist layer, which is suitable for a substrate having a film layer and a patterned photoresist layer sequentially formed thereon. A plurality of first openings are formed in the patterned photoresist layer. In the method, the patterned photoresist layer is baked at a first temperature. The first temperature is higher enough to make the patterned photoresist layer expand laterally. Then, the patterned photoresist layer is baked at a second temperature to make the patterned photoresist layer expand laterally at a linear rate, so that widths of the first openings are reduced at the linear rate to a desired dimension. The film layer is etched to form a plurality of second openings while using the photoresist layer as a mask.

The first temperature is greater than a melting point or a glass transition temperature of the patterned photoresist layer.

If the patterned photoresist layer is made of a deep-UV material and the patterned photoresist layer is used as a deep ultraviolet photoresist, the patterned photoresist layer is baked at the first temperature of about 145° C. for 90 seconds.

If the patterned photoresist layer is made of a deep-UV material and the patterned photoresist layer is used as a deep ultraviolet photoresist, the patterned photoresist layer is baked at the second temperature of about 161° C. for 70 seconds.

According to the method of this invention, the second openings can be narrowed to a critical dimension of around 80nm without needing to purchase additional equipment. Moreover, temperature used in the second baking can be adjusted to control the reduction rate of the first opening in the photoresist layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
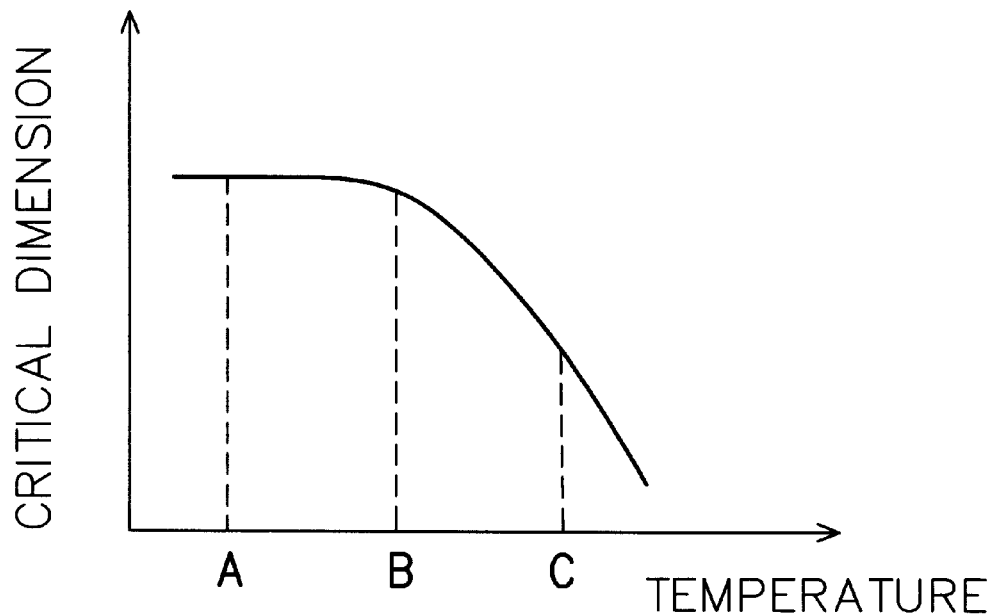
FIG. 1 is a graph showing the variation of the critical dimension of a photoresist opening versus temperature.

Reference will now be made in detail to the present preferred embodiments of the invention, examples of which are illustrated in the accompanying drawings. Wherever possible, the same reference numbers are used in the drawings and the description to refer to the same or like parts.

A photolithographic process can be subdivided into several steps including a photoresist deposition, a soft bake, an exposure, a post-exposure bake, a photoresist development and a hard bake. However, the hard baking step can be skipped depending on actual requirement.

Major constituents of photoresist include resin, sensitizer and solvent. In general, the sensitizer polymerizes with the resin or with itself when exposed to light so that the light-exposed portion of a photoresist layer is polymerized to form a structurally stable compound that resists dissolution by a developer.

However, if the photoresist layer is heated to a temperature above a melting point or glass transition temperature (Tg), the photoresist material is able to expand laterally. Such horizontal expansion of photoresist material gradually reduces the width of openings in the photoresist layer. FIG. 1 is a graph showing the variation of the critical dimension of a photoresist opening versus temperature. As shown in FIG. 1, the variation of critical dimension is non-linear. When the temperature is low, the rate of reduction of critical dimension is rather slow. As temperature of the photoresist layer increases, fluidity of the photoresist layer also increases leading to a faster rate of reduction of the critical dimension.

Figure 2:
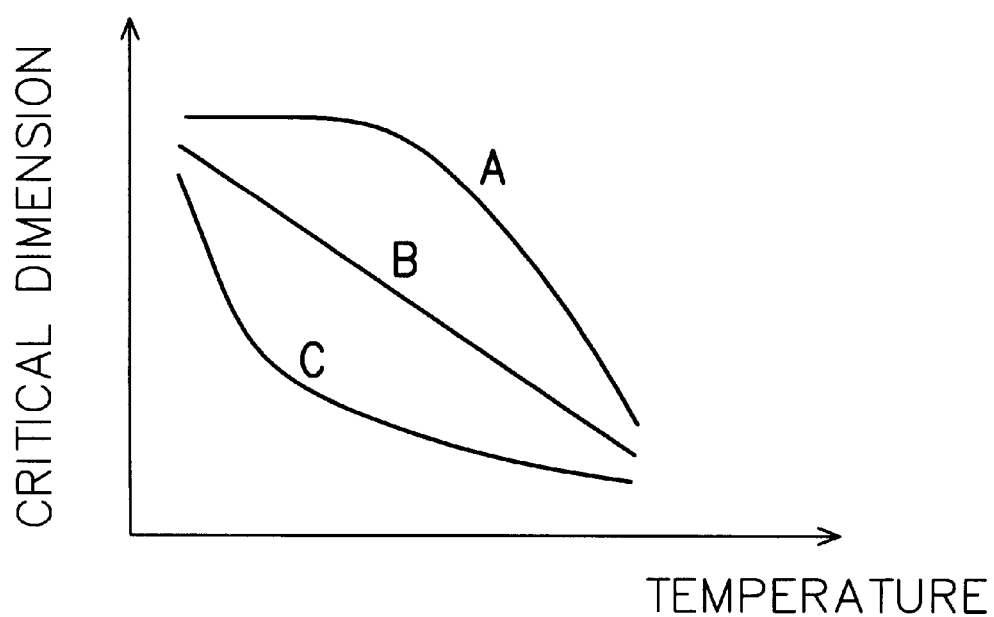
FIG. 2 is a graph showing the variation of the critical dimension of a photoresist opening versus baking time at different baking temperatures.

FIG. 2 is a graph showing the variation of the critical dimension of a photoresist opening versus baking time at different baking temperatures. If the photoresist layer is heated to a temperature A (shown in FIG. 1) for a period, curve A results (shown in FIG. 2). On the other hand, if the photoresist layer is heated to a higher temperature C (shown in FIG. 1) for the same period, curve C results (shown in FIG. 2). However, both curves A and C in FIG. 2 are non-linear. In other words, when the photoresist is heated to a temperature A or C, reduction of critical dimension is not directly proportional to the heating time.

Nevertheless, it is possible to find a temperature somewhere between point A and point C such as point B where the rate of reduction of opening width is a constant.

The temperature point B is likely to be a point of inflexion along the curve in FIG. 1. When the photoresist layer is heated to a temperature B, width of openings in a photoresist layer reduces linearly with time according to curve B in FIG. 2.

Figure 3:
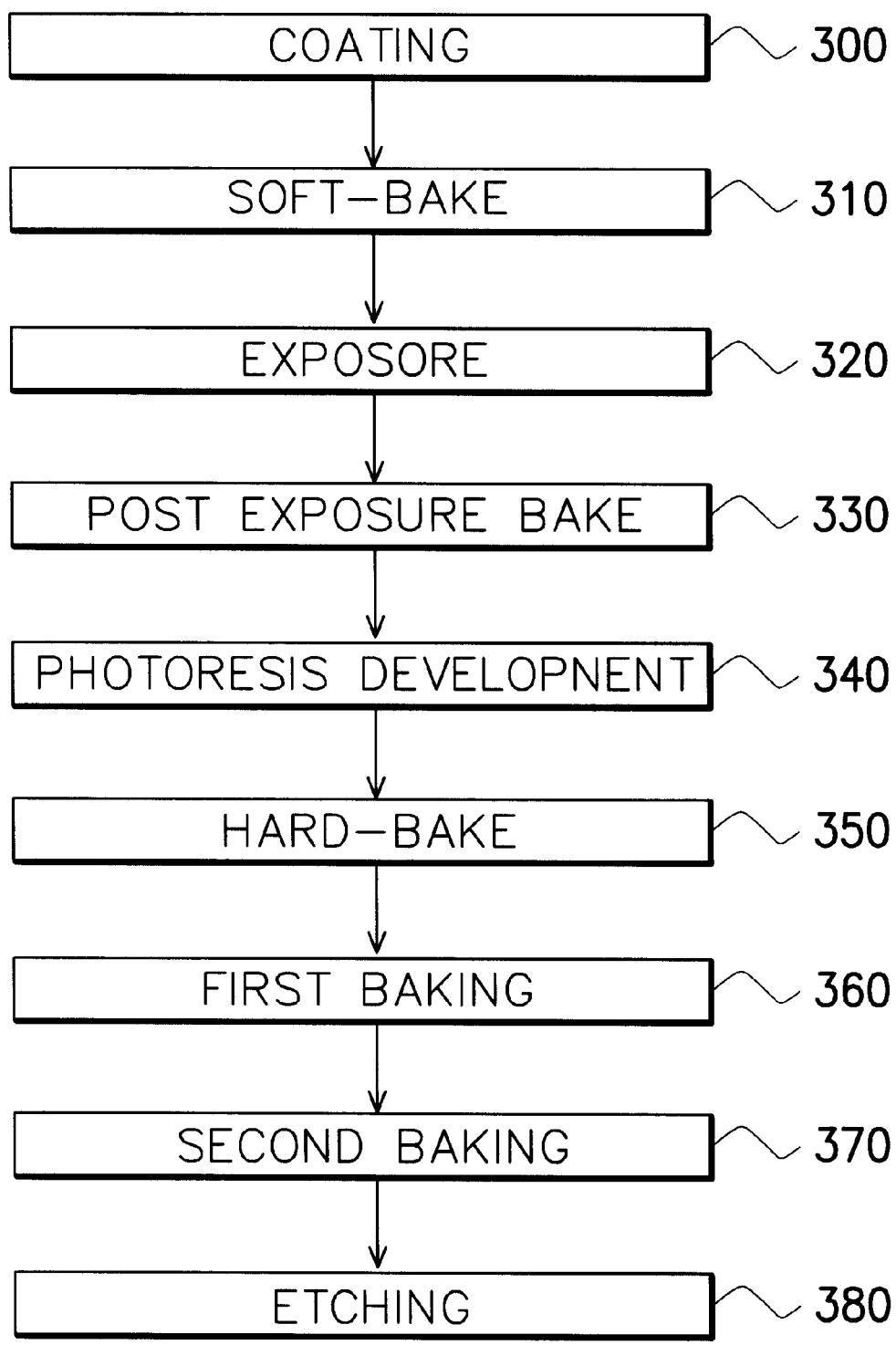
FIG. 3 is a flow chart showing the steps needed to lower the critical dimensions according to the preferred embodiment of this invention.
Figure 4A:
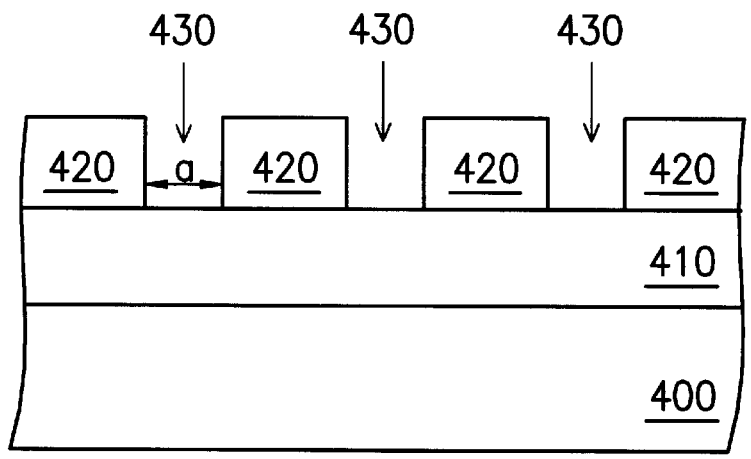
FIGS. 4A through 4C are schematic cross-sectional views showing the progression of steps in reducing critical dimensions according to the flow chart in FIG. 3.
Figure 4B:
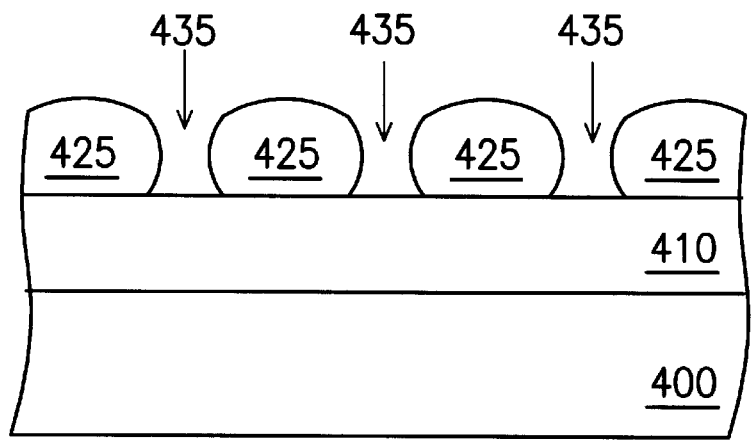
Figure 4C:
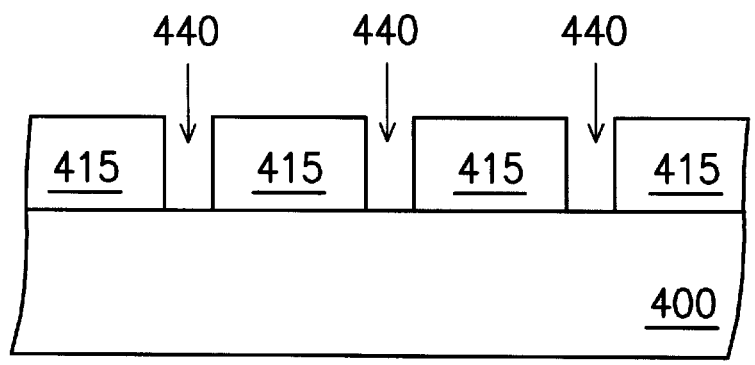

Temperature B is selected to carry out a reduction of critical dimension. FIG. 3 is a flow chart showing the steps needed to lower the critical dimensions according to the preferred embodiment of this invention. FIGS. 4A through 4C are schematic cross-sectional views showing the progression of steps in reducing critical dimensions according to the flow chart in FIG. 3. A photoresist material that is sensitive to deep ultraviolet light is used throughout to illustrate the method of this invention.

With reference to FIG. 3 and FIG. 4A - FIG. 4C, first, as shown in FIG. 4A, a film layer 410 and a patterned photoresist layer 420 is formed over a substrate 400. There are openings 430 in the patterned photoresist layer 420. Each opening 430 has a width a 10 and a distance of separation b between neighboring openings 430. The photoresist layer 420 is formed by a series of steps including coating (step 300), soft-baking (step 310), light exposure (step 320), post-exposure baking (step 330), photoresist development (step 340) and hard-baking (step 350).

A first baking (step 360) of the photoresist layer 420 is carried out. This is followed by a second baking (step 370) to form a structure as shown in FIG. 4B. At a high temperature, the photoresist layer 420 flows laterally so that a photoresist profile 425 as shown in FIG. 4B is obtained. Ultimately, the original openings 430 are transformed into openings 435. To carry out the first baking (step 360) and the second baking (step 370) of the photoresist layer, two hot plates each pre-heated to a pre-determined temperature are all that is required.

In the aforementioned first baking (step 360) operation, the temperature must be higher than the melting point of the photoresist layer 420 or the glass transition temperature (Tg) so that the photoresist layer 420 is able to flow. In the second baking (step 370) operation, a temperature must be selected such that the width of the opening 430 reduces linearly with heating time. In other words, a temperature such as point B in FIG. 1 should be chosen.

Using the photoresist layer 425 as a mask, the film layer 410 is etched (step 380) to form a patterned film layer 415 with openings 440 as shown in FIG. 4C.

When the photoresist layer 425 is made of, for example, a deep ultraviolet (deep-UV) material and the photoresist layer 425 is used as a deep ultraviolet photoresist. The deep ultraviolet photoresist of a Deep-UV lithography process is using, for example, 248- or 193-nm light as a light source. The first baking (step 360) operation can be carried out at about 145° C. for about 90 seconds. The second baking (step 370) can be carried out at about 161° C. for about 70 seconds so that width a of each opening 430 is reduced from about 254 nm to around 149 nm. When openings 440 are subsequently formed in the film layer 415, the bottom portion of each opening 440 has a width of about 100 nm, only. In other words, there is a difference of roughly 154 nm between the width of opening 430 and the width of opening 440.

Figure 5:
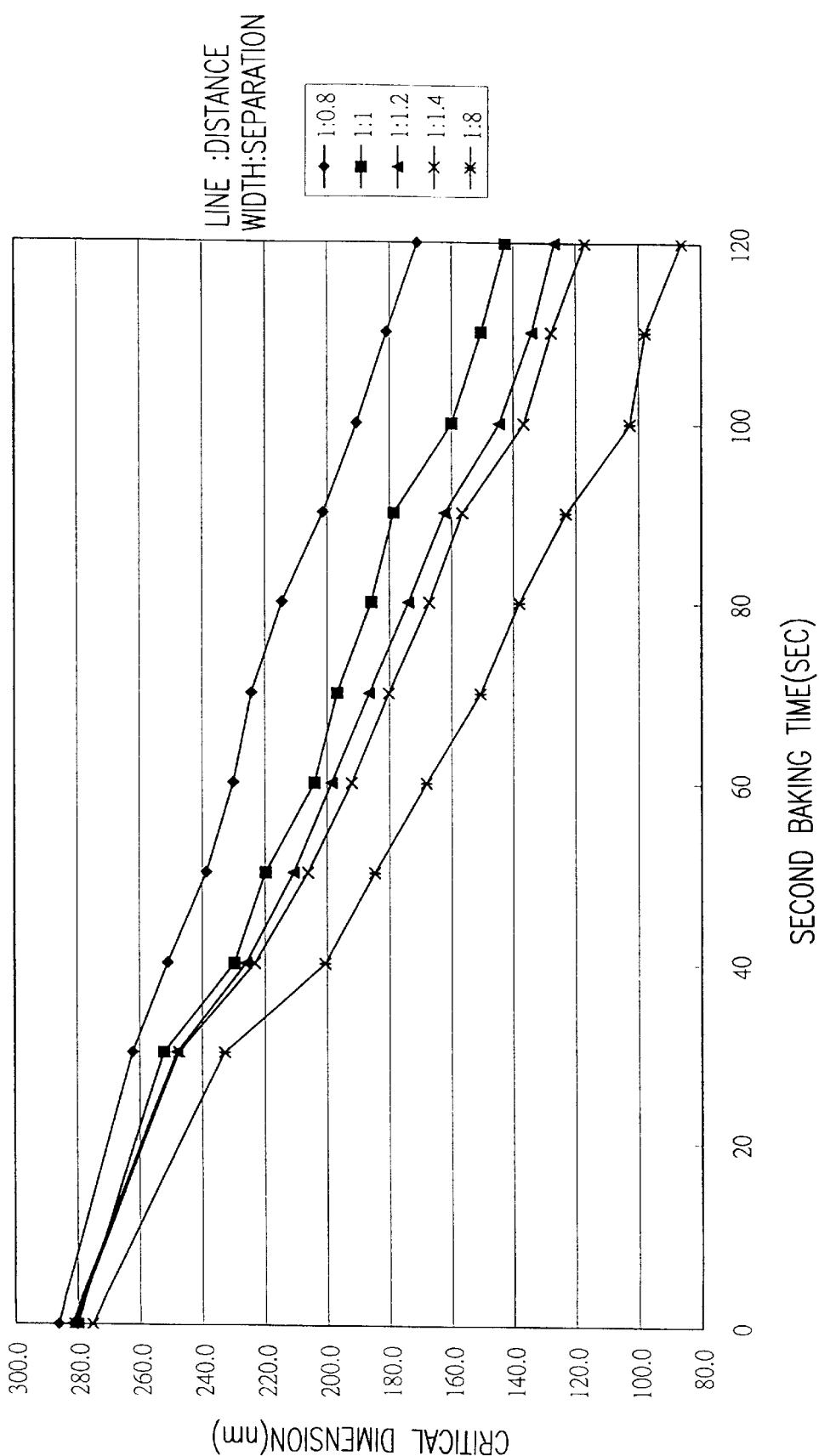
FIG. 5 is a graph showing the variation of critical dimension versus second baking time for an opening in a deep ultraviolet photoresist layer having different duty ratios.

FIG. 5 is a graph showing the variation of critical dimension versus second baking time for an opening in a deep ultraviolet photoresist layer having different initial duty ratio. The initial duty ratio (the ratio a:b in FIG. 4A) ranges from 1:0.8 to 1:8. After the openings 430 have been heated by the second baking step, an almost linear opening width versus baking time curve is obtained. Furthermore, by adjusting the temperatures used in the first (step 360) and the second baking (step 370) operations, respectively, a reduction rate of about 1 nm/sec for each opening 430 can be obtained. Hence, engineers are able to form an opening with the desired critical dimension with ease. For example, as shown in FIG. 5, critical dimension of the opening 430 can be reduced from 278 nm to 85 nm within 120 seconds when the duty ratio is 1:8.

In summary, the advantages of the method in this invention include:

1. The production of devices with a line width smaller than 0.1 μm is possible without sophisticated equipment. Therefore, superior products can be made without needing to purchase costly new machines.

2. By adjusting the temperatures in the first and the second baking operations, respectively, a suitable reduction rate for the openings can be obtained. Hence, engineers are more capable of designing openings with the desired critical dimension.

3. The method is also suitable for reducing openings in a patterned photoresist layer that has a range of line width to distance of separation ratios.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of reducing a critical dimension of a patterned photoresist layer, which is suitable for a substrate having a film layer and a patterned photoresist layer sequentially formed thereon, wherein a plurality of first openings are formed in the patterned photoresist layer to expose the underlying film layer, the method comprising:

baking the patterned photoresist layer at a first temperature, wherein the first temperature is high enough to make the patterned photoresist layer expand laterally;

baking the patterned photoresist layer at a second temperature to make the patterned photoresist layer expand laterally at a linear rate, so that widths of the first openings are reduced at the linear rate to a desired dimension; and etching the film layer to form a plurality of second openings while using the photoresist layer as a mask.

2. The method of claim 1, wherein the first temperature is greater than a melting point of the patterned photoresist layer.

3. The method of claim 1, wherein the first temperature is greater than the glass transition temperature of the patterned photoresist layer.

4. The method of claim 1, wherein the step of baking the patterned photoresist layer at the first temperature includes heating the patterned photoresist layer at a temperature of about 145° C. for 90 seconds if the patterned photoresist layer is made of a deep-UV material.

5. The method of claim 1, wherein the step of baking the patterned photoresist layer at the second temperature includes heating the patterned photoresist layer at a temperature of about 161° C. for 70 seconds if the patterned photoresist layer is made of a deep-UV material.

6. A method of reducing a critical dimension of a patterned photoresist layer, which is suitable for a substrate having a patterned photoresist layer formed thereon, wherein a plurality of first openings are formed in the patterned photoresist layer to expose the underlying film layer, the method comprising:

baking the patterned photoresist layer at a first temperature, wherein the first temperature is high enough to make the patterned photoresist layer expand laterally; and baking the patterned photoresist layer at a second temperature to make the patterned photoresist layer expand laterally at a fixed rate.

7. The method of claim 6, wherein the first temperature is greater than a melting point of the patterned photoresist layer.

8. The method of claim 6, wherein the first temperature is greater than the glass transition temperature of the patterned photoresist layer.

9. The method of claim 6, wherein the step of baking the patterned photoresist layer at the first temperature includes heating the patterned photoresist layer at a temperature of about 145° C. for 90 seconds if the patterned photoresist layer is made of a deep-UV material.

10. The method of claim 6, wherein the step of baking the patterned photoresist layer at the second temperature includes heating the patterned photoresist layer at a temperature of about 161° C. for 70 seconds if the patterned photoresist layer is made of a deep-UV material.

11. A method of reducing a critical dimension of a patterned photoresist layer, which is suitable for a substrate having a film layer and a patterned photoresist layer sequentially formed thereon, wherein a plurality of first openings are formed in the patterned photoresist layer to expose the underlying film layer, the method comprising:

carrying out first baking of the patterned photoresist layer at a temperature which is greater than the glass transition temperature of the patterned photoresist layer to make the patterned photoresist layer expand laterally;

carrying out second baking of the patterned photoresist layer to make the patterned photoresist layer expand laterally at a linear rate, so that widths of the first openings are reduced at the linear rate to a desired dimension; and etching the film layer to form a plurality of second openings while using the photoresist layer as a mask.

12. The method of claim 11, wherein the step of carrying out the first baking includes heating the patterned photoresist layer at a temperature of about 145° C. for about 90 seconds if the patterned photoresist layer is made of a deep-UV material.

13. The method of claim 11, wherein the step of carrying out the second baking includes heating the patterned photoresist layer at a temperature of about 161° C. for about 70 seconds if the patterned photoresist layer is made of a deep-UV material.

* * * * *